(12) United States Patent
Chou et al.

(10) Patent No.: US 8,026,585 B2
(45) Date of Patent: Sep. 27, 2011

(54) DIE STACKING STRUCTURE AND FABRICATING METHOD THEREOF

(75) Inventors: Yung-Fa Chou, Kaohsiung (TW); Ding-Ming Kwai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 177 days.

(21) Appl. No.: 12/484,250

(22) Filed: Jun. 15, 2009

(65) Prior Publication Data

US 2010/0244220 A1    Sep. 30, 2010

(30) Foreign Application Priority Data

Mar. 31, 2009  (TW) .............................. 98110661 A (51) Int. Cl.
*H01L 23/02*  (2006.01)
(52) U.S. Cl. . 257/686; 257/690; 257/698; 257/E23.011; 438/109; 438/129
(58) Field of Classification Search .................. 257/686, 257/690, 698, E23.011; 438/109, 129
See application file for complete search history.

(56) References Cited

U.S. PATENT DOCUMENTS

| | | | |
|---|---|---|---|
| 5,497,027 A * | 3/1996 | Crafts ........................... | 257/528 |
| 7,355,273 B2 | 4/2008 | Jackson et al. | |
| 2002/0137255 A1 * | 9/2002 | Wang et al. ................... | 438/107 |
| 2005/0073038 A1 * | 4/2005 | Kuo et al. ...................... | 257/690 |
| 2005/0247665 A1 * | 11/2005 | Oi et al. ........................... | 216/13 |
| 2006/0055017 A1 * | 3/2006 | Cho et al. ...................... | 257/686 |
| 2006/0088955 A1 * | 4/2006 | Tsai .............................. | 438/108 |
| 2007/0045814 A1 * | 3/2007 | Yamamoto et al. ........... | 257/698 |

* cited by examiner

*Primary Examiner* — Thanh V Pham
*Assistant Examiner* — Duy Nguyen
(74) *Attorney, Agent, or Firm* — Jianq Chyun IP Office (57) ABSTRACT

A layout structure and layout method are provided. The layout structure includes a first conductive via, a second conductive via, a die and eight pads. The first conductive via and the second conductive via pass through the die. The first conductive via has a first pad and a second pad, and the second conductive via has a third pad and a fourth pad. A fifth pad is conducted to the third pad. A sixth pad is conducted to the second pad. A seventh pad is conducted to the first pad. An eighth pad is conducted to the fourth pad. In a vertical direction of the die, the first pad and the second pad are overlapped, the third pad and the fourth pad are overlapped, the fifth pad and the sixth pad are overlapped, and the eighth pad and the seventh pad are overlapped, partially or totally.

16 Claims, 13 Drawing Sheets

DIE STACKING STRUCTURE AND FABRICATING METHOD THEREOF

CROSS-REFERENCE TO RELATED APPLICATION

This application claims the priority benefit of Taiwan application serial no. 98110661, filed Mar. 31, 2009. The entirety of the above-mentioned patent application is hereby incorporated by reference herein and made a part of specification.

TECHNICAL FIELD

The present invention relates to a layout structure and a method of a die. More particularly, the present invention relates to a layout structure and a method of stacked dies.

BACKGROUND

In a present technique of manufacturing transistors on a single die, by arranging stacked dies along a vertical direction, the dies with different functions or fabricated based on different techniques can be integrated, so as to resolve a difficulty of fabricating the transistors of different functions and different types on the single die. However, regarding a signal connecting layout in the stacked dies, a conventional technique is to change positions of bond pads through redistribution layer (RDL) routing at a front side or a back side of the die, and bond the stacked dies through micro bumps. By such means, the signal can be transmitted among the dies sequentially through the routing, the bond pads, the micro bumps and through silicon vias (TSVs).

Generally, the above connecting technique probably fixes a transmission mode of the signal among the stacked dies. Namely, if the signal transmission mode of the stacked dies is required to be changed, not only a layout of the micro bumps need to be changed, but also the RDL routing at the front side and the back side of the dies have to be totally changed, so as to cope with requirement of a new design. Further, redesigning of the RDL routing can increase a fabrication cost.

SUMMARY

Exemplary embodiments are directed to a layout structure of a die, in which two conductive vias pass through the die, four pads and four wires are configured at both sides of the die, and at least one conductive bump is coupled to at least one of the pads, so that the four pads can be mutually connected in various approaches.

Exemplary embodiments are directed to a layout method of a die, by which two conductive vias passing through the die are formed, four pads and four wires are formed at both sides of the die, and at least one conductive bump is formed on at least one of the pads, and the four pads can be mutually connected in various approaches.

An exemplary embodiment provides a layout structure of a die. The layout structure of the die includes a first conductive via, a second conductive via, a first die, and a first to an eighth pads. The first conductive via passes through the first die, and the first conductive via includes a first pad and a second pad, wherein the first pad is located at a first side of the first die, the second pad is located at a second side of the first die, and the first pad and the second pad are partially or totally overlapped in a vertical direction of the first die. The second conductive via passes through the first die, and the second conductive via includes a third pad and a fourth pad, wherein the third pad is located at the first side of the first die, the fourth pad is located at the second side of the first die, and the third pad and the fourth pad are partially or totally overlapped in a vertical direction of the first die. The fifth pad is located at the first side of the first die and is conducted to the third pad. The sixth pad is located at the second side of the first die and is conducted to the second pad, and the sixth pad and the fifth pad are partially or totally overlapped in a vertical direction of the first die. The seventh pad is located at the first side of the first die and is conducted to the first pad. The eighth pad is located at the second side of the first die and is conducted to the fourth pad, and the eighth pad and the seventh pad are partially or totally overlapped in a vertical direction of the first die.

An exemplary embodiment provides a layout method of a die. The method can be described as follows. A first conductive via is formed on a first die, wherein the first conductive via passes through the first die, and the first conductive via includes a first pad and a second pad, wherein the first pad is located at a first side of the first die, the second pad is located at a second side of the first die, and the first pad and the second pad are partially or totally overlapped in a vertical direction of the first die. A second conductive via is formed on the first die, wherein the second conductive via passes through the first die, and the second conductive via includes a third pad and a fourth pad, wherein the third pad is located at the first side of the first die, the fourth pad is located at the second side of the first die, and the third pad and the fourth pad are partially or totally overlapped in the vertical direction of the first die. A fifth pad is formed at the first side of the first die, and the fifth pad is conducted to the third pad. Next, a sixth pad is formed at the second side of the first die, wherein the sixth pad is conducted to the second pad, and the sixth pad and the fifth pad are partially or totally overlapped in the vertical direction of the first die. A seventh pad is formed at the first side of the first die, and the seventh pad is conducted to the first pad. Next, an eighth pad is formed at the second side of the first die, wherein the eighth pad is conducted to the fourth pad, and the eighth pad and the seventh pad are partially or totally overlapped in the vertical direction of the first die.

Accordingly, regarding a layout structure of a die, a device structure of the conductive via, and examples for configurations of the wires and the conductive bumps are provided. Signals can be transmitted within the stacked dies through paths formed by the wires and the conductive bumps. When a design is changed, it can be achieved by only changing a configuration of the conductive bumps.

It is to be understood that both the foregoing general description and the following detailed description are exemplary and explanatory only and are not restrictive of the invention, as claimed.

DESCRIPTION OF EMBODIMENTS

Figure 1A:
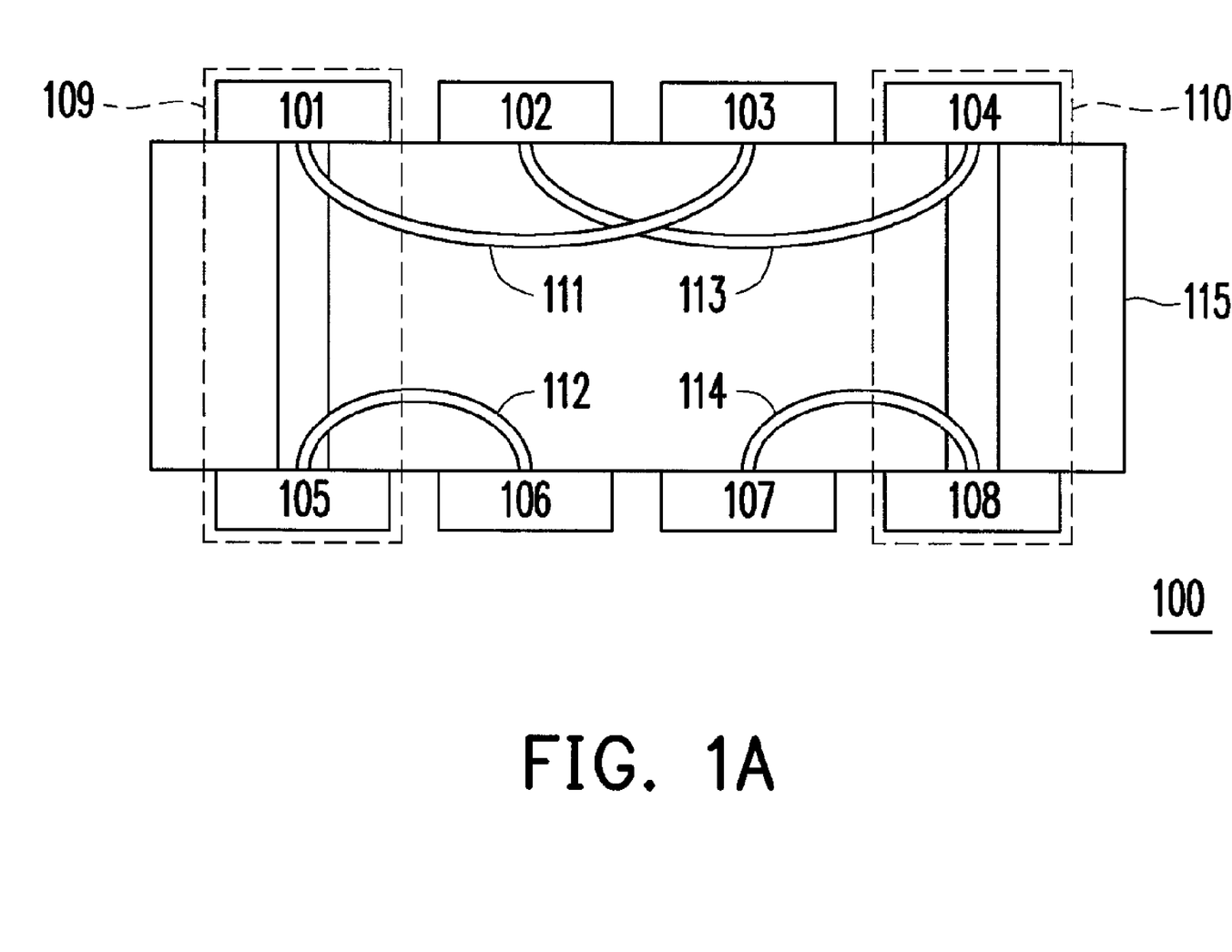
FIG. 1A is a schematic diagram illustrating a layout structure of a die according to an embodiment.
Figure 1B:
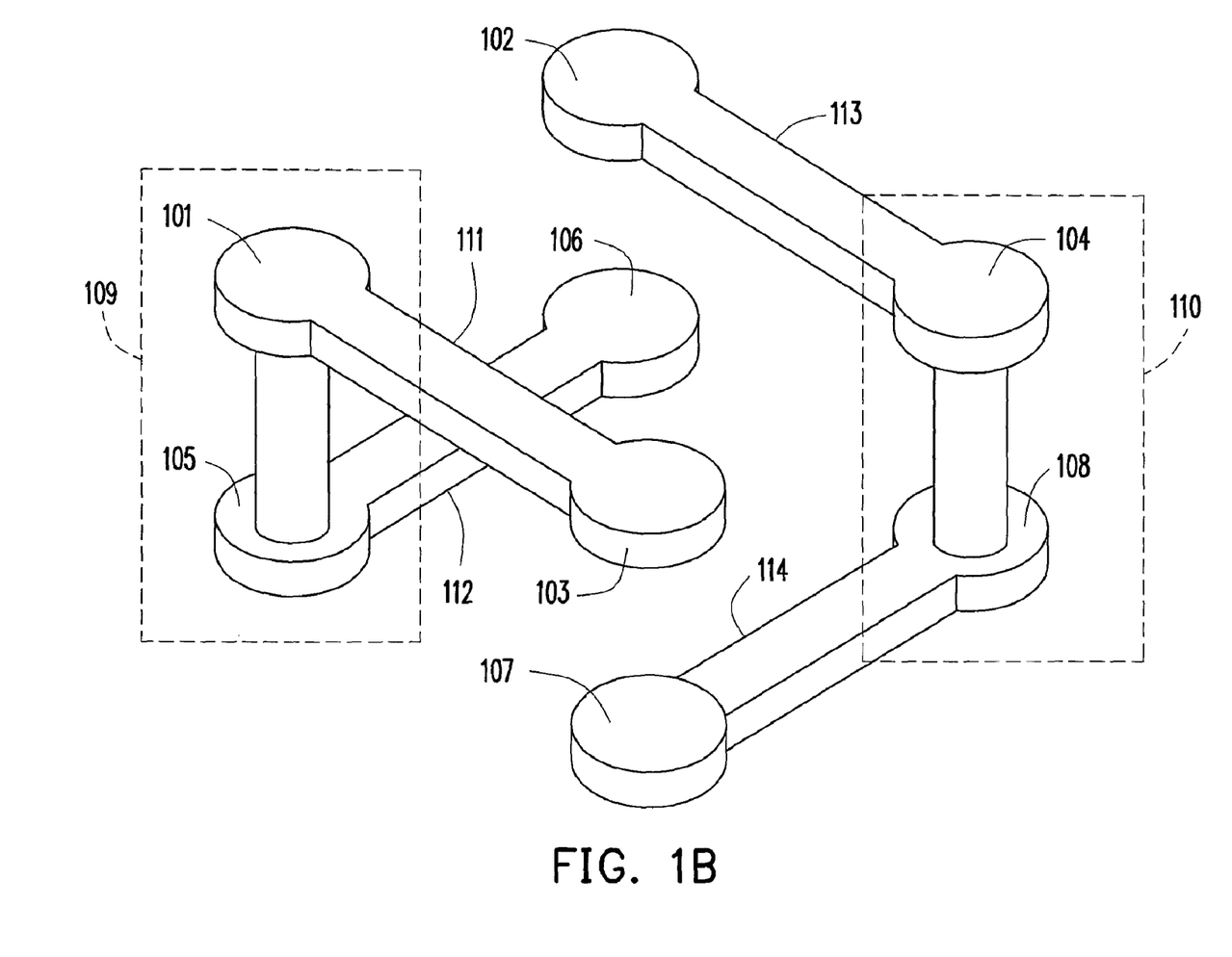
FIG. 1B is a partially amplified three-dimensional diagram of FIG. 1A.

FIG. 1A is a schematic diagram illustrating a layout structure of a die according to an embodiment. FIG. 1B is a partially amplified three-dimensional diagram of FIG. 1A. Referring to FIG. 1A and FIG. 1B, the die layout structure 100 includes a first conductive via 109 and a second conductive via 110, wherein the first conductive via 109 and the second conductive via 110 pass through a die 115. In the present embodiment, the conductive vias 109 and 110 are through silicon vias (TSVs), which can form a device structure of a twisted TSV. The conductive via 109 includes a first pad 101 and a second pad 105, wherein the two pads are respectively located at a top side and a bottom side of the die 115. Moreover, the first pad 101 and the second pad 105 are partially or totally overlapped in a vertical direction of the die 115. In the embodiment of FIG. 1A, the two pads are totally overlapped. On the other hand, the conductive via 110 includes a third pad 104 and a fourth pad 108, wherein the two pads are also respectively located at the top side and the bottom side of the die 115. Moreover, the third pad 104 and the fourth pad 108 are partially or totally overlapped in the vertical direction of the die 115. In the embodiment of FIG. 1A, the two pads are totally overlapped in the vertical direction of the die 115.

A fifth pad 102 and a seventh pad 103 are configured at the top side of the die 115, wherein the pad 102 is conducted to the pad 104, and the pad 103 is conducted to the pad 101, and a conducting method thereof is that a third wire 113 is used to connect the pads 102 and 104, and a first wire 111 is used to connect the pads 103 and 101. On the other hand, a sixth pad 106 and an eighth pad 107 are configured at the bottom side of the die 115, wherein the pad 106 is conducted to the pad 105, and the pad 107 is conducted to the pad 108, and a conducting method thereof is that a second wire 112 is used to connect the pads 106 and 105, and a fourth wire 114 is used to connect the pads 107 and 108. Further, the pad 102 and the pad 106 are partially or totally overlapped in the vertical direction of the die 115, and the pad 103 and the pad 107 are partially or totally overlapped in the vertical direction of the die 115. In the embodiment of FIG. 1A, the pads are all totally overlapped in the vertical direction of the die 115.

Accordingly, based on various paths formed by a plurality of the pads, a plurality of the conductive vias and a plurality of the wires, a signal (not shown) can be transmitted from the top side of the die 115 to the bottom side of the die 115, and the signal can be transmitted from the bottom side to the top side. Besides, layouts of the wires 111-114 in the vertical direction of the die 115 are diversified, so as to form various signal transmission paths. For example, in the vertical direction of the die 115, an angle formed between the wire 111 and the wire 112 can be arbitrary or 90 degrees, or the wires 111 and 112 can be none-parallel. The layout of the wire 113 and the wire 114 in the vertical direction of the die 115 is the same to the layout of the wires 111 and 112. Further, in the vertical direction of the die 115, the wire 111 can be perpendicular to the wire 112, the wire 112 can be perpendicular to the wire 113, and the wire 113 can be perpendicular to the wire 114.

Figure 1C:
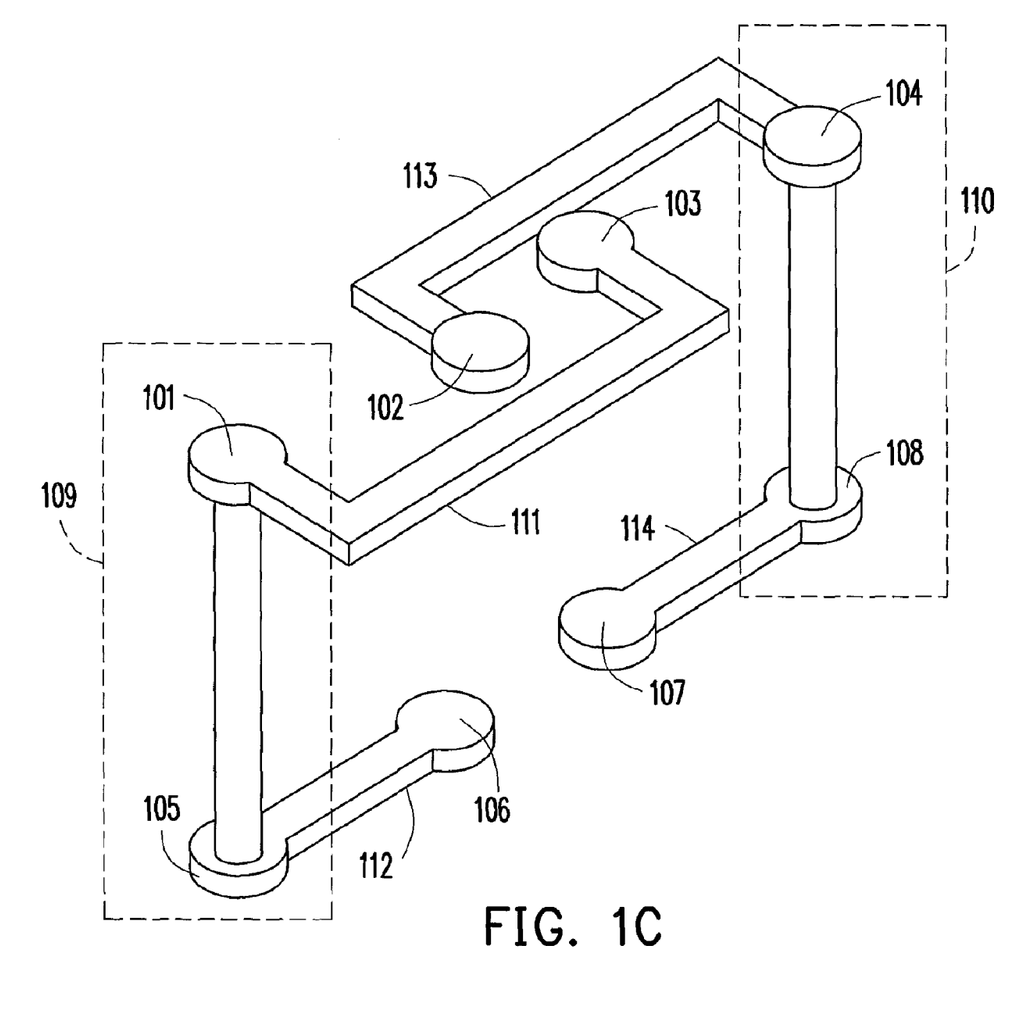
FIG. 1C is another partially amplified three-dimensional diagram of FIG. 1A.
Figure 1D:
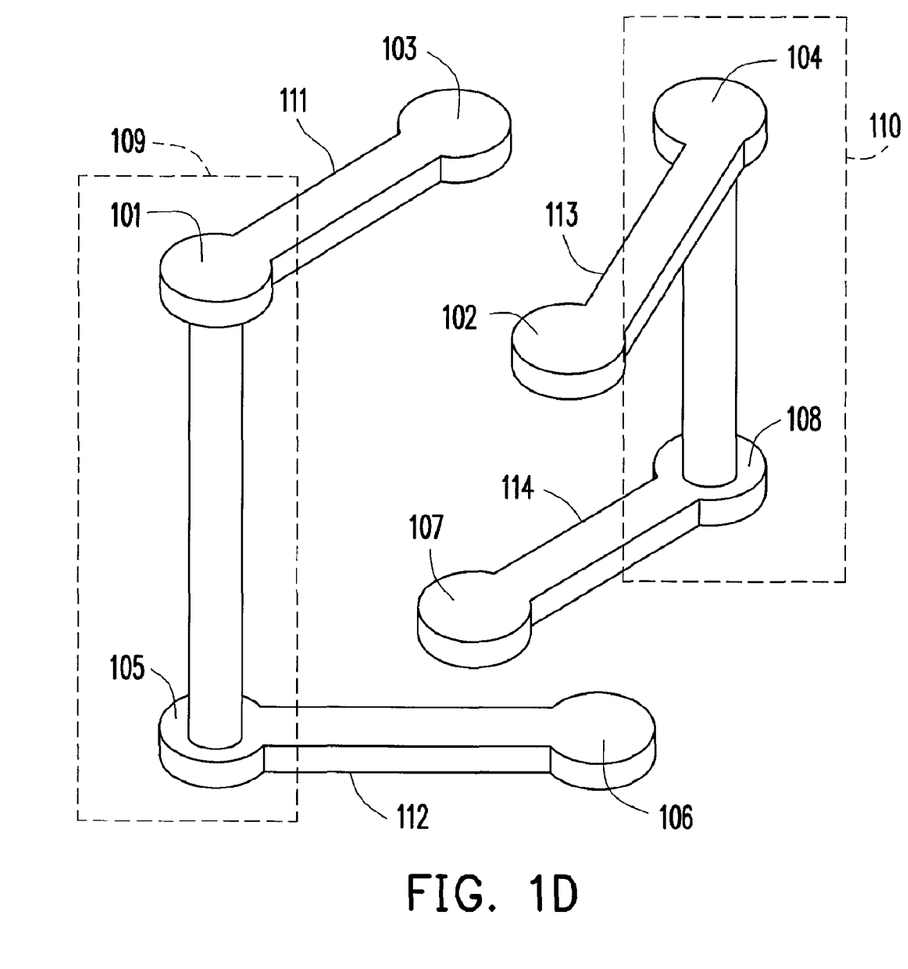
FIG. 1D is another partially amplified three-dimensional diagrams of FIG. 1A.

Besides the partially amplified three-dimensional diagram of FIG. 1B, the die layout structure 100 can be other possible layout structures. FIG. 1C and FIG. 1D are other partially amplified three-dimensional diagrams of FIG. 1A. Referring to FIG. 1C, the pads 101-104 are located at the top side of the die 115, and the pads 105-108 are located at the bottom side of the die 115, which are respectively arranged in a straight line. Therefore, the wire 111 can bypass the pad 102 according to a bending layout, and the wire 113 can also bypass the pad 104 according to the bending layout. On the other hand, referring to FIG. 1D, the pads 101-104 are located at the top side of the die 115, and the pads 105-108 are located at the bottom side of the die 115, which have a layout as that shown in FIG. 1D. Therefore, the wires 111-114 also have the corresponding layouts. Further, in the vertical direction of the die 115, the pads shown in FIG. 1B, FIG. 1C and FIG. 1D may have the same design. In other words, in the vertical direction of the die 115, the pad 101 is partially or totally overlapped to the pad 105, the pad 104 is partially or totally overlapped to the pad 108, the pad 102 is partially or totally overlapped to the pad 106, and the pad 103 is partially or totally overlapped to the pad 107.

Figure 2A:
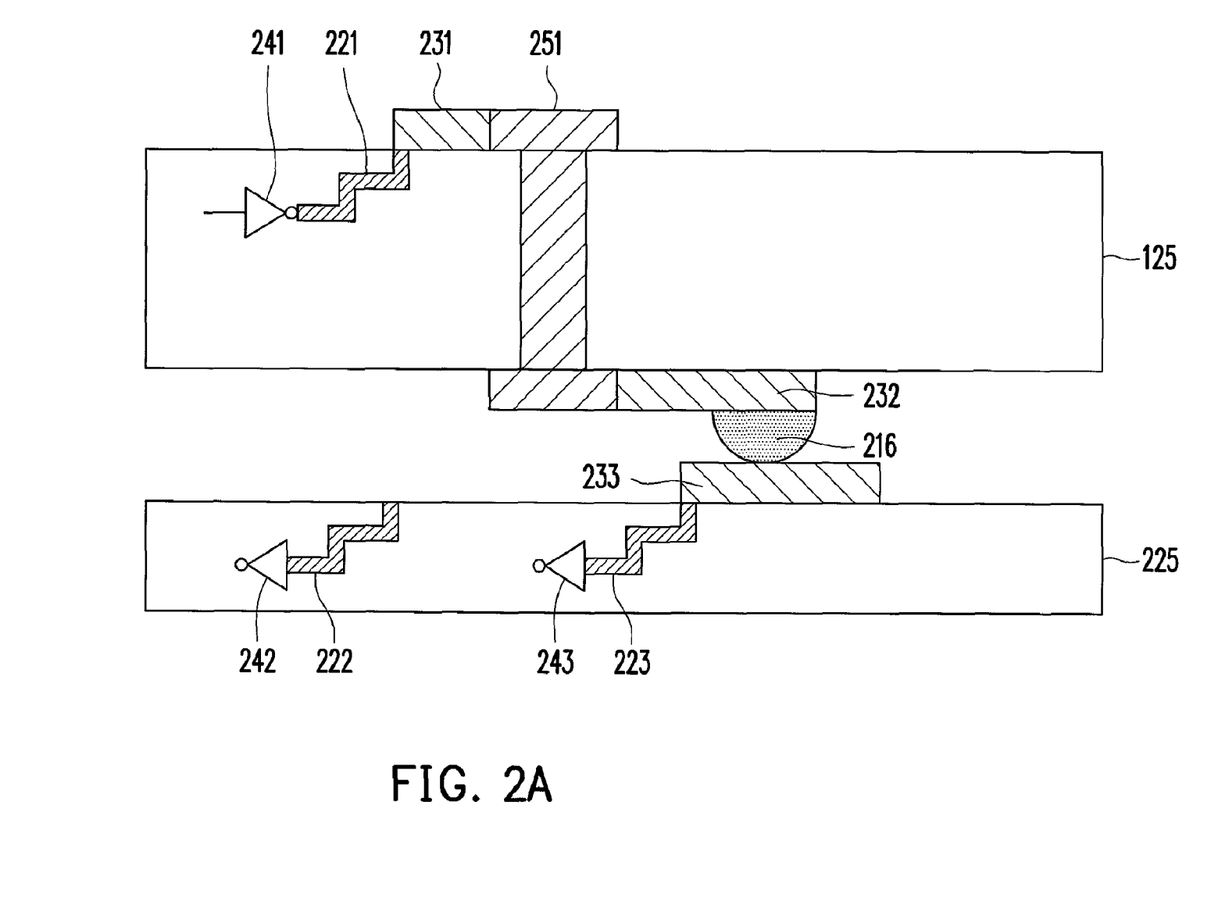
FIG. 2A is a schematic diagram illustrating a conventional layout structure of a die.

In an actual application of the die layout, the die layout structure of the present embodiment has a lower cost compared to a conventional die layout structure. FIG. 2A is a schematic diagram illustrating a conventional die layout structure. Referring to FIG. 2A, a die 125 includes an output device 241, wherein the output device 241 can be an internal output circuit of the die 125. When the output device 241 outputs a signal (not shown) to an input device 243 of a die 225, the signal is transmitted to the bottom side of the die 125 through a signal line 221, a wire 231 and a conductive via 251. Thereafter, the signal is transmitted to the top side of the die 225 through a wire 232, a conductive bump 216 and a wire 233, and is finally transmitted to the input device 243 through a signal line 223.

Figure 2B:
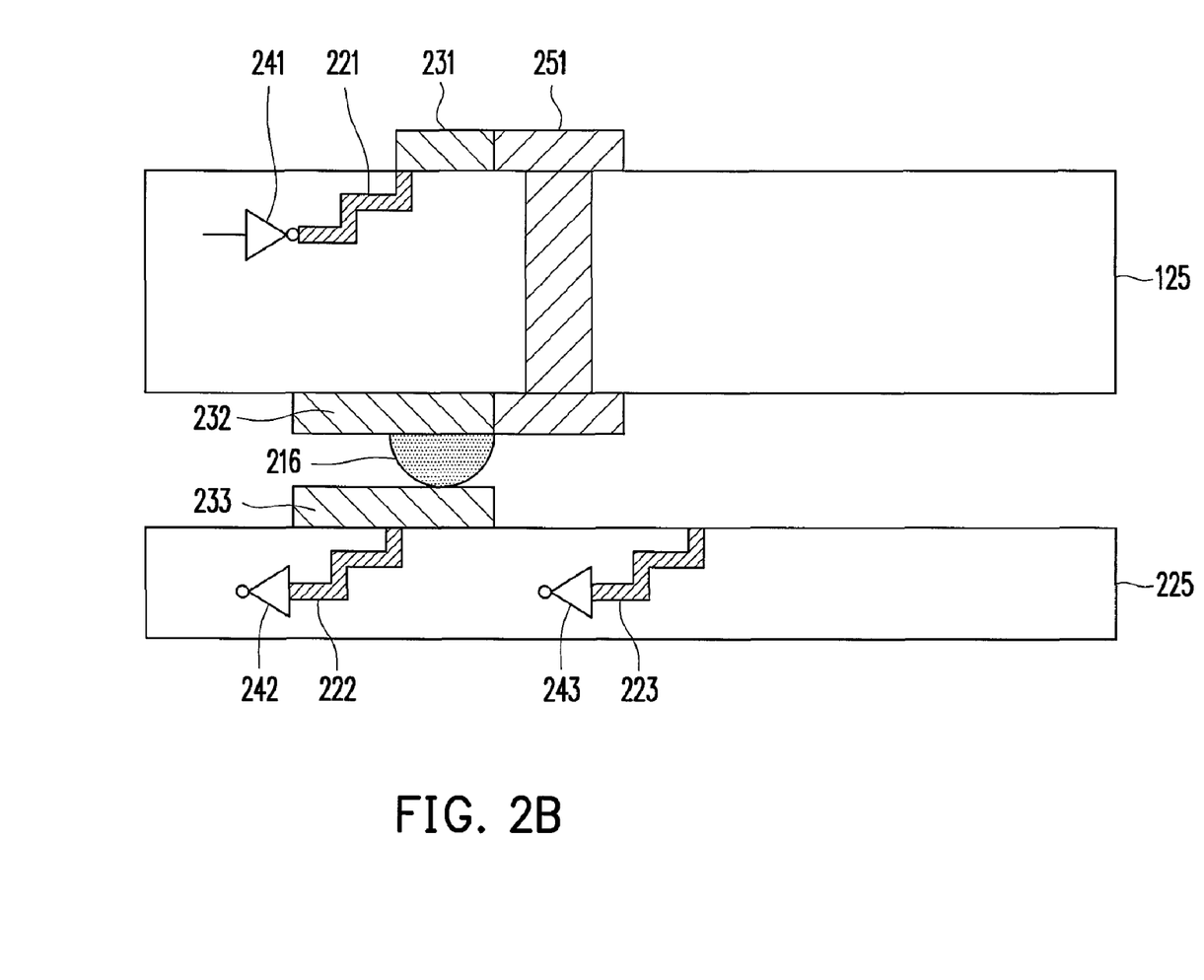
FIG. 2B is a schematic diagram illustrating another conventional layout structure of a die.

FIG. 2B is a schematic diagram illustrating another conventional layout structure of a die. Referring to FIG. 2B, during designing of the circuit, an original design of the circuit is probably renewed. Comparing FIG. 2A and FIG. 2B, according to the original design of FIG. 2A, the output device 241 transmits the signal to the input device 243 of the die 225. A novel design is as that shown in FIG. 2B, by which the output device 241 is about to transmit the signal to an input device 242 of the die 225. Therefore, parts to be renewed include the wire 232, the wire 233 and the conductive bump 216. Further, the RDL routing of the wires 232 and 233 of FIG. 2A has to be changed, and a configuration of the conductive bump 216 has to be renewed, so as to cope with the layout of FIG. 2B. Therefore, a fabrication cost is increased.

Figure 3A:
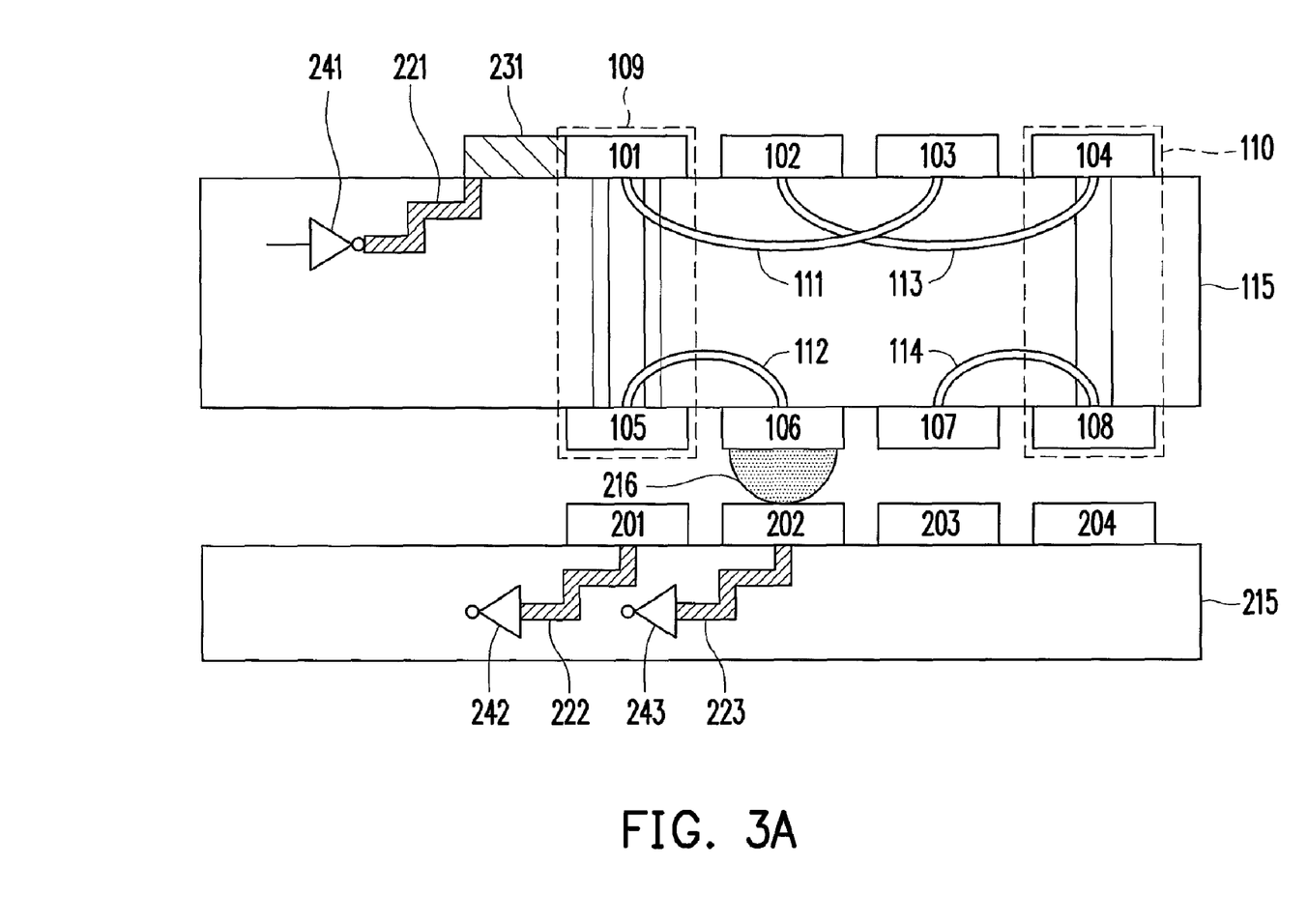
FIG. 3A is a schematic diagram illustrating another layout structure of a die according to an embodiment.

On the other hand, in an actual application of the die layout, the fabrication cost of the die layout structure of the present embodiment can be reduced. FIG. 3A is a schematic diagram illustrating another layout structure of a die according to an embodiment. Referring to FIG. 3A, the die 115 has the same layout structure as that in the embodiment of FIG. 1A, and the die 215 includes pads 205-208. Further, when the output device 241 transmits a signal (not shown) to the input device 243 of the die 215, the signal can be transmitted to the bottom side of the die 115 through a signal line 221, a wire 231, a pad 101, a conductive via 109, a pad 105 and a pad 106. Thereafter, the signal is transmitted to the input device 243 through a conductive bump 216, a pad 206 and a signal line 223.

Figure 3B:
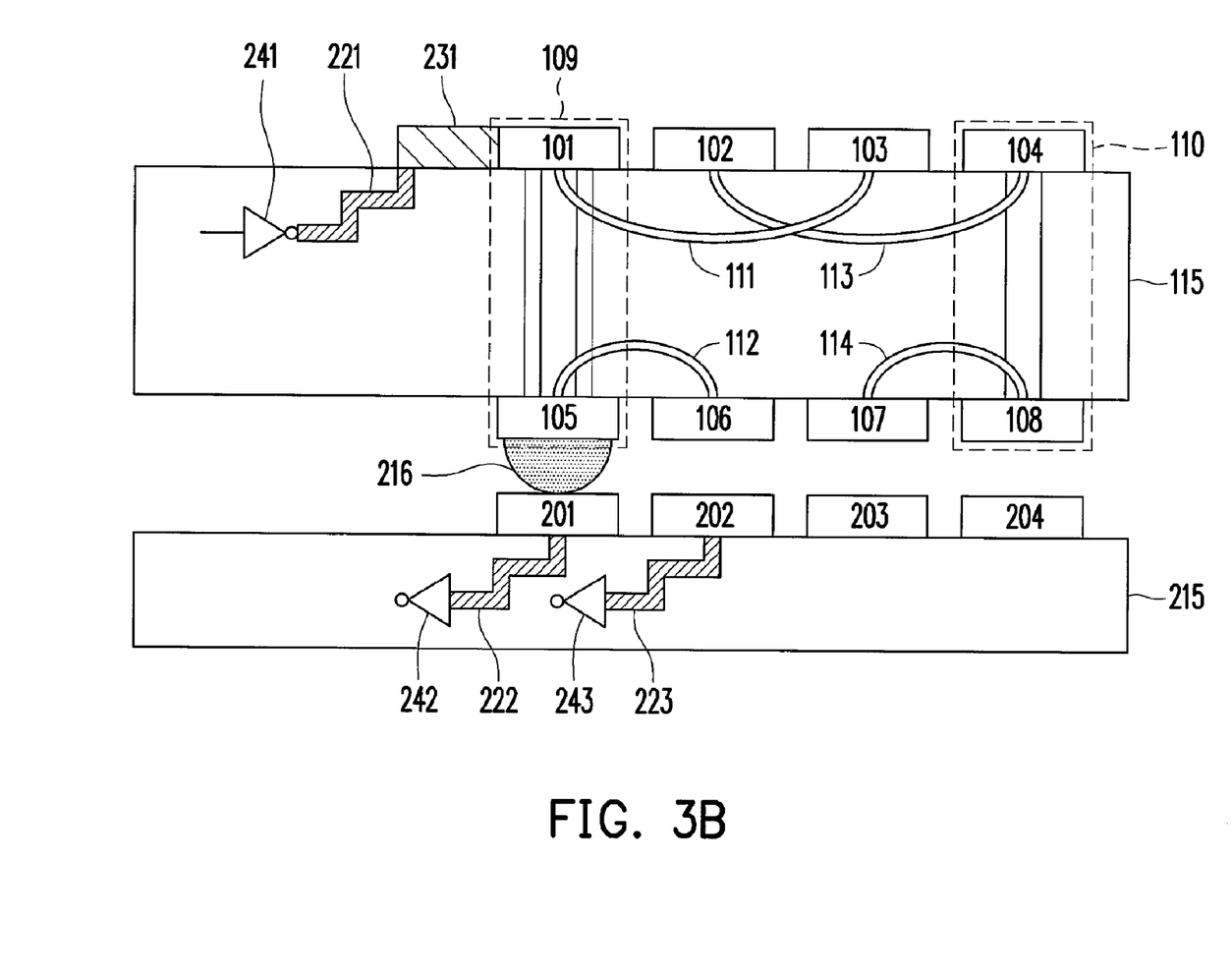
FIG. 3B is a schematic diagram illustrating another layout structure of a die according to an embodiment.

FIG. 3B is another schematic diagram illustrating a layout structure of a die according to an embodiment. During designing of the circuit, an original design of the circuit is probably renewed. The original design is shown in FIG. 3A, and the renewed design is shown in FIG. 3B. Comparing FIG. 3A and FIG. 3B, the output device 241 now transmits the signal to the input device 242 of the die 215. Therefore, the part to be renewed only includes the layout of the conductive bump 216, so that the fabrication cost is reduced compared to the conventional technique.

According to the aforementioned die layout structure, when a plurality of dies is stacked, the conductive bumps are formed between the dies for transmitting the signal among the stacked dies, and through the pads in each layer of the dies that are coupled to the conductive bumps, the signal can be transmitted among the stacked dies in various paths. Further, regarding a design of a single die, the pads can be connected by the conductive bumps. In the present embodiment, two stacked dies 115 and 215 are taken as an example, and the twisted TSV structures (i.e. the die layout structure 100) are respectively configured at the corresponding positions of the dies 115 and 215. Five connecting modes are categorised according to different arrangement approaches of the conductive bumps.

Single-connecting Mode

Figure 4:
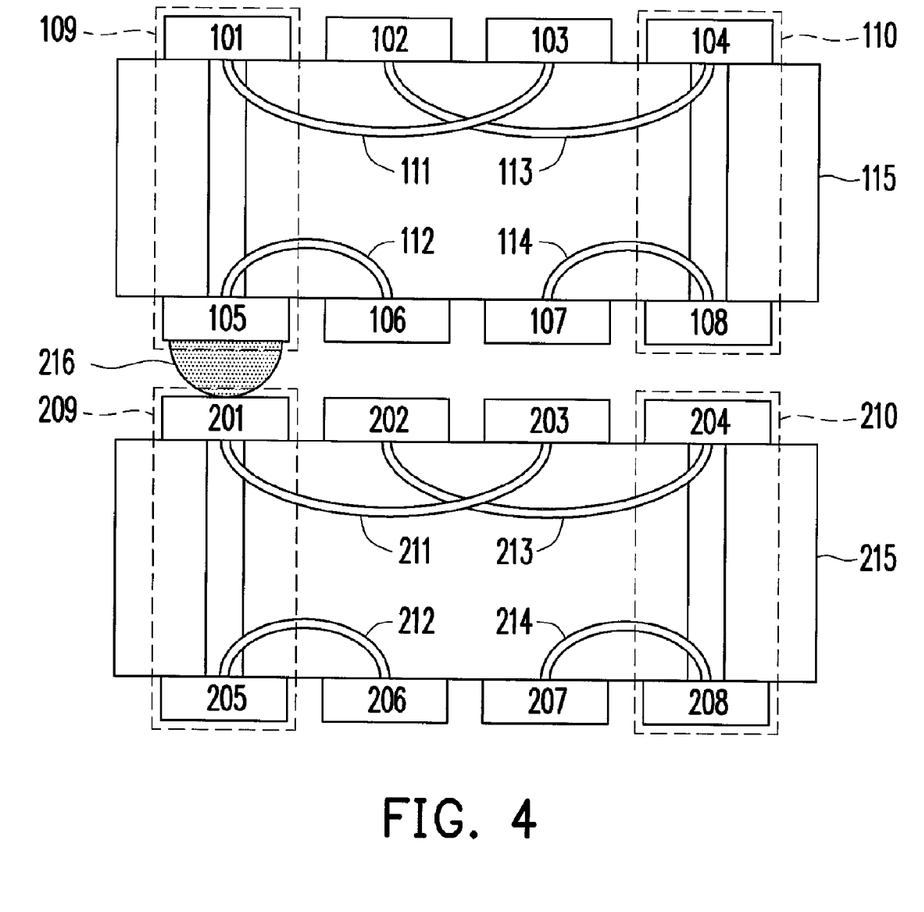
FIG. 4 is a schematic diagram illustrating a die layout structure of a single-connecting mode according to an embodiment.

FIG. 4 is a schematic diagram illustrating a die layout structure of a single-connecting mode according to an embodiment. In case of the single-connecting mode, the two dies are connected through only one conductive bump. Referring to FIG. 4, the conductive bump 216 is configured between the bottom side of the die 115 and the top side of the die 215, wherein the conductive bump 216 is selectively coupled between two pads, for example, between the pad 106 and a fifth pad 202, or between the pad 108 or a third pad 204, or between the pad 107 or a seventh pad 203. In the present embodiment, the conductive bump 216 is coupled between the pad 105 and a first pad 201.

According to the single-connecting mode shown in FIG. 4, the pads 101, 103, 105 and 106 of the die 115 and the pads 201, 203, 205 and 206 of the die 215 are mutually connected, so that the signal (not shown) can be transmitted from the pad 101 (or the pad 103) of the die 115 to the pads 201 and 203 of the die 215 through the conductive via 109 and the conductive bump 216, and can be further transmitted to the second pad 205 and the sixth pad 206 through a third conductive via 209. Furthermore, when the conductive bump 216 is only changed to be coupled between the pads 106 and 202, or between the pads 107 and 203, or between the pads 108 and 204, the path formed according to the above coupling methods can be correspondingly changed.

Transmission Mode

Figure 5:
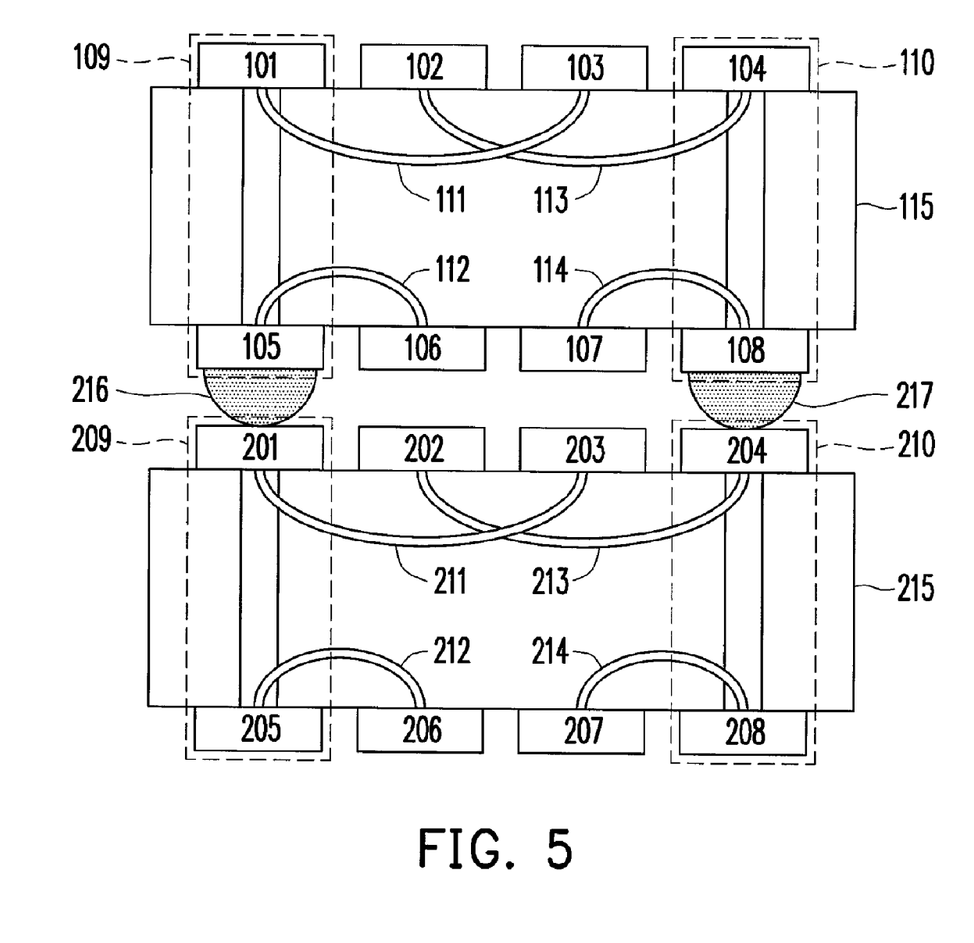
FIG. 5 is a schematic diagram illustrating a die layout structure of a transmission mode according to an embodiment.

FIG. 5 is a schematic diagram illustrating a die layout structure of a transmission mode according to an embodiment. In case of the transmission mode, the two dies are connected through two conductive bumps, and each of the two conductive bumps is coupled to the conductive vias of the two dies. Referring to FIG. 5, the conductive bumps 216 and 217 are configured between the bottom side of the die 115 and the top side of the die 215, wherein the conductive bump 216 is coupled between the pad 105 of the conductive via 109 and the pad 201 of the conductive via 209, and the conductive bump 217 is coupled between the pad 108 of the conductive via 110 and the pad 204 of a fourth conductive via 210. By such means, the pads 101, 103, 105 and 106 of the die 115 and the pads 201, 203, 205 and 206 of the die 215 are mutually connected. On the other hand, the pads 102, 104, 107 and 108 of the die 115 and the pads 202, 204, the eighth pads 207 and the fourth pad 208 of the die 215 are mutually connected.

Broadcasting Mode

Figure 6:
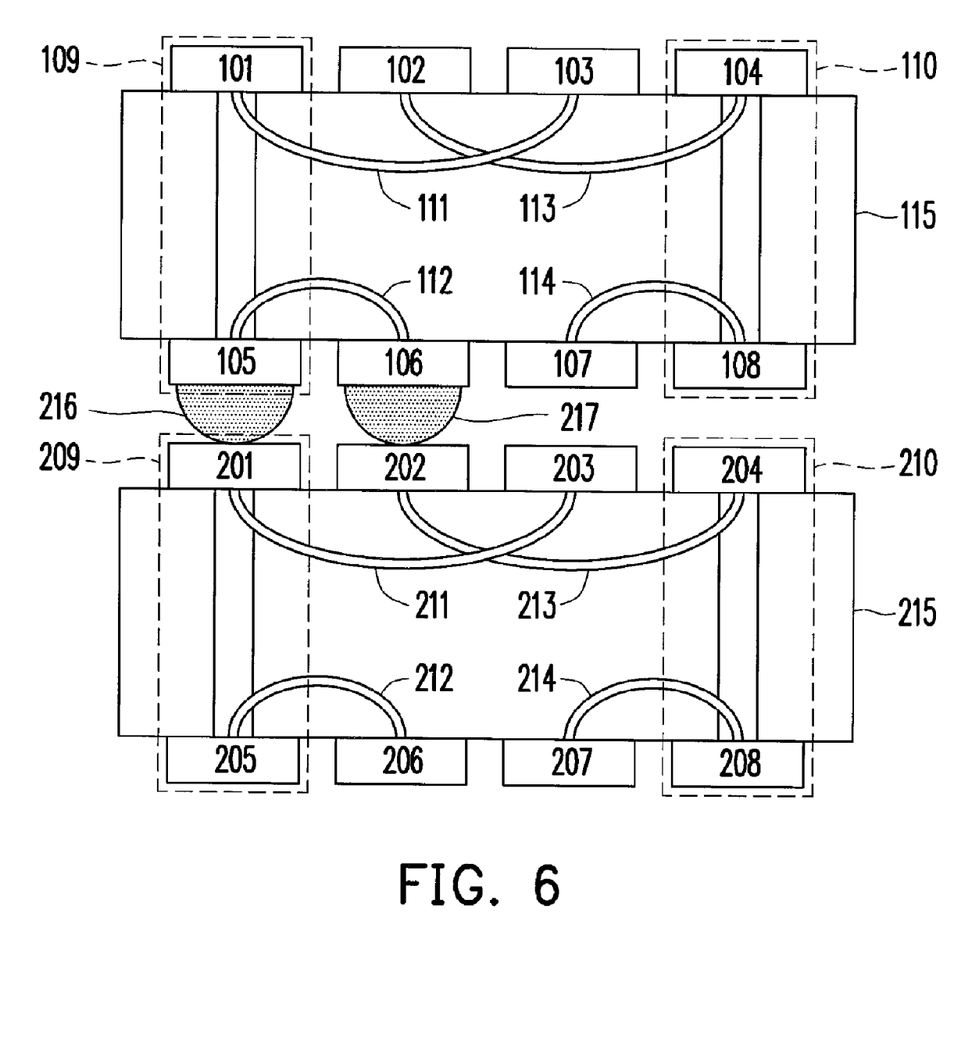
FIG. 6 is a schematic diagram illustrating a die layout structure of a broadcasting mode according to an embodiment.

FIG. 6 is a schematic diagram illustrating a die layout structure of a broadcasting mode according to an embodiment. In case of the broadcasting mode, the two dies are connected through the two conductive bumps 216 and 217, wherein the conductive bump 216 is coupled between the pads 105 and 201, and the conductive bump 217 is coupled between the pads 106 and 202. By such means, the signal can be transmitted from the pad 101 (or the pad 103) of the die 115 to the pads 201, 202, 203 and 204 of the die 215 through the conductive via 109, and the conductive bumps 216 and 217, and can be further transmitted to the pads 205, 206, 207 and 208 through the conductive vias 209 and 210.

Different broadcasting paths can be achieved by changing the positions of the conductive bumps 216 and 217. For example, by coupling the conductive bump 216 between the pads 107 and 203, and coupling the conductive bump 217 between the pads 108 and 204, the signal can be transmitted from the pad 104 (or the pad 102) of the die 115 to the pads 201, 202, 203 and 204 of the die 215 through the conductive via 110. For another example, by coupling the conductive bump 216 between the pads 105 and 201, and coupling the conductive bump 217 between the pads 107 and 203, the signal can be transmitted from the pad 205 (or the pad 206) of the die 215 to the pads 105, 106, 107 and 108 of the die 115 through the conductive via 209, and can be further transmitted to the pads 101, 102, 103 and 104 through the conductive vias 109 and 110.

Exchange Mode

Figure 7:
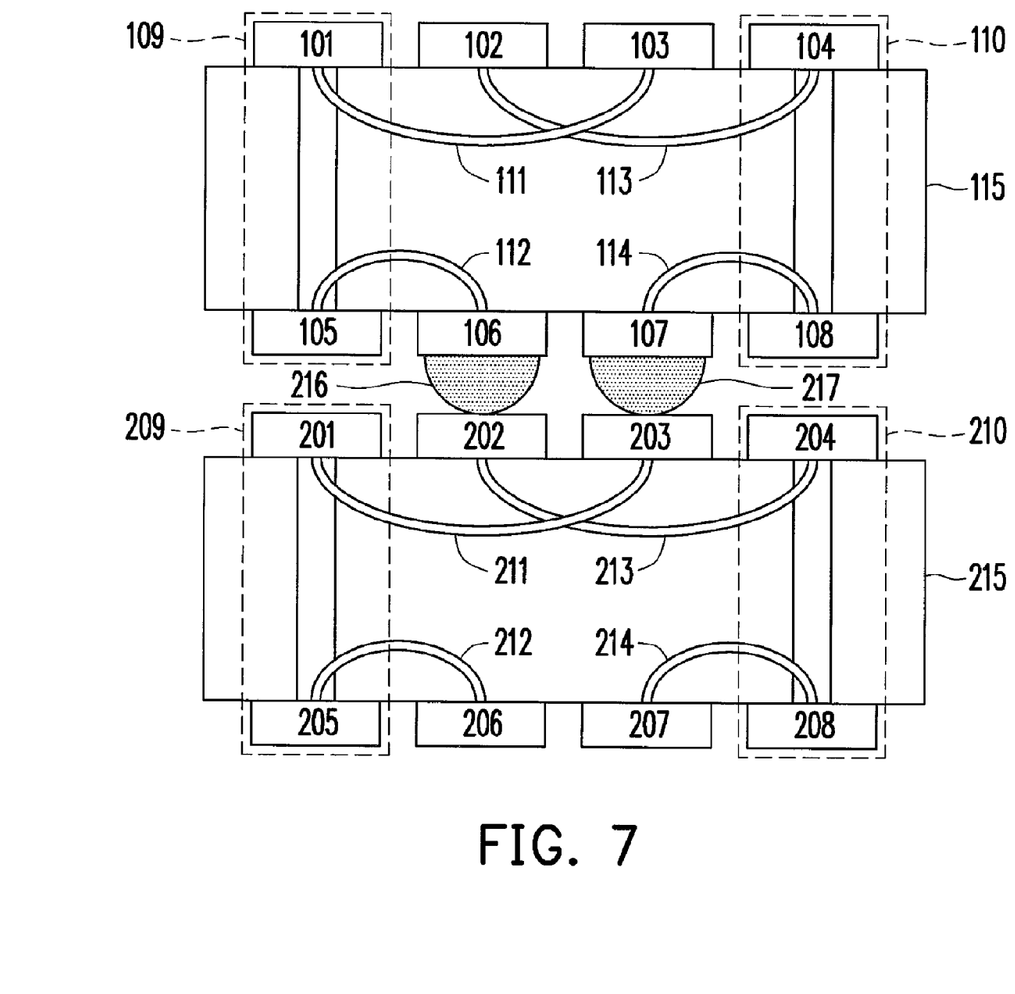
FIG. 7 is a schematic diagram illustrating a die layout structure of an exchange mode according to an embodiment.

FIG. 7 is a schematic diagram illustrating a die layout structure of an exchange mode according to an embodiment. In case of the exchange mode, the two dies are connected through two conductive bumps, wherein the pads coupled to the two conductive bumps are not the pads of the conductive vias. Referring to FIG. 7, the conductive bump 216 is coupled between the pads 106 and 202, and the conductive bump 217 is coupled between the pads 107 and 203, wherein the pads 106, 202, 107 and 203 are not the pads of the conductive vias. By such means, the pads 101, 103, 105 and 106 of the die 115 and the pads 202, 204, 207 and 208 of the die 215 are mutually connected. Moreover, the pads 102, 104, 107 and 108 of the die 115 and the pads 201, 203, 205 and 206 of the die 215 are mutually connected.

Non-connecting Mode

According to a design of the die layout structure, the non-connecting mode represents that none conductive bump is coupled between the two dies. Referring to FIG. 4, in case of the non-connecting mode, the conductive bump 216 is not coupled between the dies 115 and 215, so that none pad of the die 115 is coupled to the pad of the die 215. Further, the signal on the pad of the die 115 cannot be transmitted to the die 215.

Besides the aforementioned various connecting modes, the die layout structure can be designed according to an actual requirement. For example, at least one conductive bump is coupled to at least one pad of a die. Taking the embodiment of FIG. 3A as an example, the die 115 includes the conductive bump 216, and according to a further design, at least one conductive bump can be coupled to the pads 101-108 of the die 115. On the other hand, at least one conductive bump can be formed between the two dies to couple at least one pad of the two dies. The die layout structure of FIG. 4 only includes one conductive bump, and the die layout structures of FIGS. 5-7 respectively include two conductive bumps. According to a further design, three or four conductive bumps can be formed between the two dies to connect the pads of the two dies.

Figure 8:
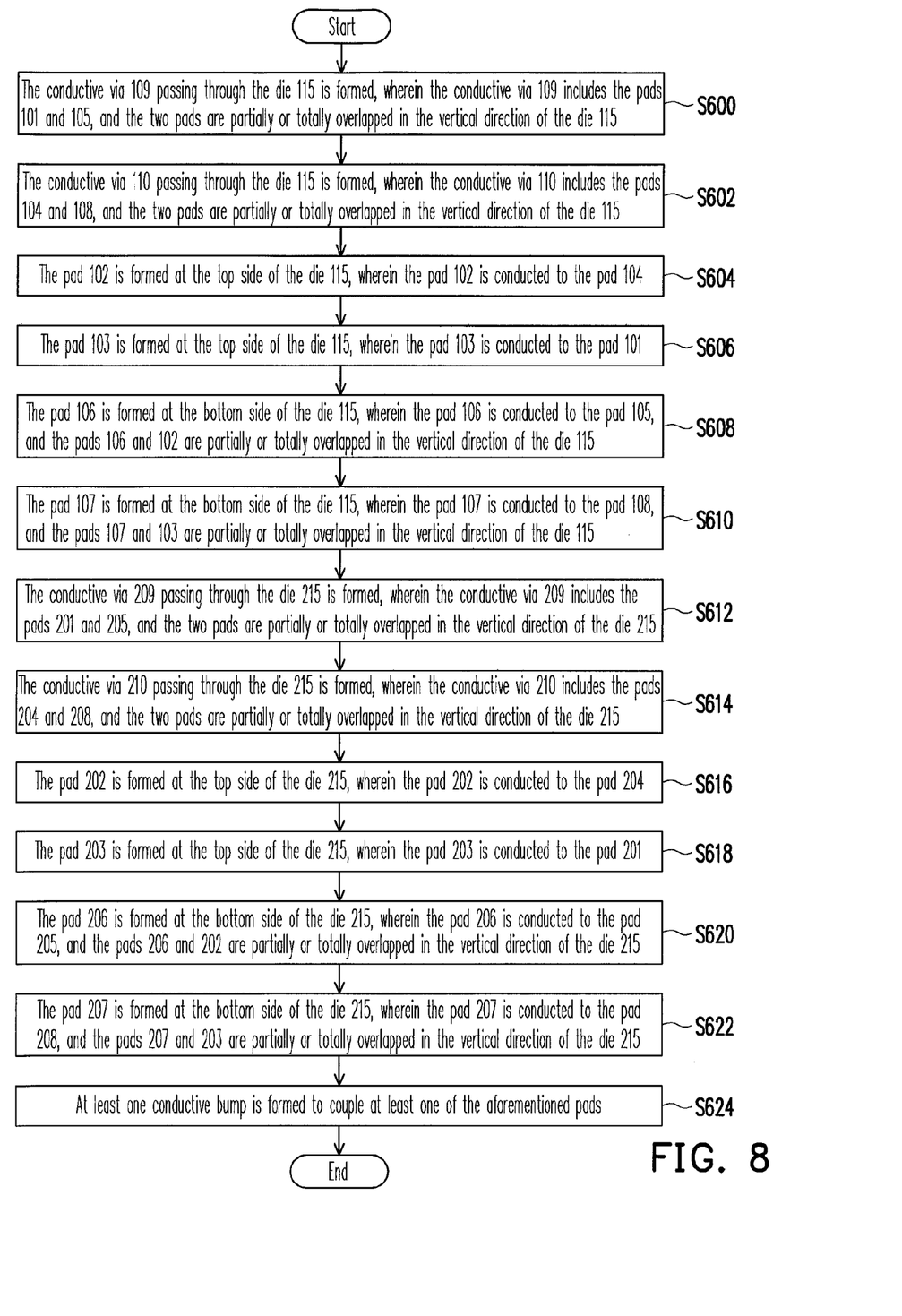
FIG. 8 is a flowchart illustrating a layout method of a die according to an embodiment.

According to the aforementioned die layout structures, a layout method of a die is provided. FIG. 8 is a flowchart illustrating a layout method of a die according to an embodiment. Referring to FIG. 8, the conductive via 109 passing through the die 115 is formed, wherein the conductive via 109 includes the pads 101 and 105, and the two pads are respectively located at the top side and the bottom side of the die 115, and are partially or totally overlapped in the vertical direction of the die 115 (step S600). Next, the conductive via 110 passing through the die 115 is formed, wherein the conductive via 110 includes the pads 104 and 108, and the two pads are respectively located at the top side and the bottom side of the die 115, and are partially or totally overlapped in the vertical direction of the die 115 (step S602). Next, the pad 102 is formed at the top side of the die 115, wherein the pad 102 is conducted to the pad 104 (step S604). Next, the pad 103 is formed at the top side of the die 115, wherein the pad 103 is conducted to the pad 101 (step S606).

Next, the pad 106 is formed at the bottom side of the die 115, wherein the pad 106 is conducted to the pad 105, and the pads 106 and 102 are partially or totally overlapped in the vertical direction of the die 115 (step S608). Next, the pad 107 is formed at the bottom side of the die 115, wherein the pad 107 is conducted to the pad 108, and the pads 107 and 103 are partially or totally overlapped in the vertical direction of the die 115 (step S610). Next, the conductive via 209 passing through the die 215 is formed, wherein the conductive via 209 includes the pads 201 and 205, and the two pads are respectively located at the top side and the bottom side of the die 215, and are partially or totally overlapped in the vertical direction of the die 215 (step S612). Next, the conductive via 210 passing through the die 215 is formed, wherein the conductive via 210 includes the pads 204 and 208, and the two pads are respectively located at the top side and the bottom side of the die 215, and are partially or totally overlapped in the vertical direction of the die 215 (step S614).

Next, the pad 202 is formed at the top side of the die 215, wherein the pad 202 is conducted to the pad 204 (step S616). Next, the pad 203 is formed at the top side of the die 215, wherein the pad 203 is conducted to the pad 201 (step S618). Next, the pad 206 is formed at the bottom side of the die 215, wherein the pad 206 is conducted to the pad 205, and the pads 206 and 202 are partially or totally overlapped in the vertical direction of the die 215 (step S620). Next, the pad 207 is formed at the bottom side of the die 215, wherein the pad 207 is conducted to the pad 208, and the pads 207 and 203 are partially or totally overlapped in the vertical direction of the die 215 (step S622). Next, at least one conductive bump is formed to couple at least one of the aforementioned pads (step S624).

According to the aforementioned die layout structures, and the above-described connecting modes, the layout cost of an actual die layout design can be reduced. Taking the transmission mode of FIG. 5 and the exchange mode of FIG. 7 as an example, different signal transmission paths can be formed according to the transmission mode and the exchange mode. If the original die layout structure applies the transmission mode of FIG. 5, the pad 102 can be connected to the pad 207 through the pads 104, 108, 204 and 208. Now, if the design is renewed to connect the pad 102 to the pad 206, according to the conventional technique, the front side and the back side RDL routing of the dies 115 and 215 have to be wholly changed, and the layout of the conductive bumps has to be renewed, so as to cope with a requirement of a new design. However, according to the aforementioned descriptions of the present embodiment, only the configuration of the conductive bumps is required to be changed, so as to cope with the requirement of the new design. In brief, as long as the configuration of the conductive bumps of the transmission mode of FIG. 5 is renewed to the configuration of the conductive bumps of the exchange mode of FIG. 7, the pad 102 can be connected to the pad 206 through the pads 104, 108, 107, 203, 201 and 205, so as to cope with the requirement of the new design.

In summary, regarding a layout structure of a die, a device structure of the conductive vias, and examples for configurations of the wires and the conductive bumps are provided. Base on the configuration of the wires and the device structure of the conductive vias, the signal can be transmitted within the dies through various paths. According to the die layout structure and the configuration of the conductive bumps, the signal can be transmitted within the stacked dies through the paths formed based on various connecting modes. Therefore, when a design is renewed, it can be achieved by only changing the configuration of the conductive bumps.

It will be apparent to those skilled in the art that various modifications and variations can be made to the structure of the embodiments provided without departing from the scope or spirit of the invention. In view of the foregoing, it is intended that the invention cover modifications and variations of embodiments provided they fall within the scope of the following claims and their equivalents.

What is claimed is:
1. A die stacking structure, comprising:
a first die, comprising:
a first conductive via, passing through the first die, wherein the first conductive via comprises a first pad and a second pad, the first pad is located at a first side of the first die, the second pad is located at a second side of the first die, and the first pad and the second pad are partially or totally overlapped in a vertical direction of the first die;
a second conductive via, passing through the first die, wherein the second conductive via comprises a third pad and a fourth pad, the third pad is located at the first side of the first die, the fourth pad is located at the second side of the first die, and the third pad and the fourth pad are partially or totally overlapped in a vertical direction of the first die;
a fifth pad, located at the first side of the first die;
a sixth pad, located at the second side of the first die, and the sixth pad and the fifth pad being partially or totally overlapped in a vertical direction of the first die;
a seventh pad, located at the first side of the first die; and
an eighth pad, located at the second side of the first die, and the eighth pad and the seventh pad being partially or totally overlapped in a vertical direction of the first die
a first wire, located at the first side of the first die, wherein the first pad and the seventh pad are directly connected by the first wire;
a second wire, located at the second side of the first die, wherein the second pad and the sixth pad are directly connected by the second wire;
a third wire, located at the first side of the first die, wherein the third pad and the fifth pad are directly connected by the third wire;
a fourth wire, located at the second side of the first die, wherein the fourth pad and the eighth pad are directly connected by the fourth wire;
a second die, wherein at least four pads located at one side of the second die; and at least one first conductive bump, selectively connected to at least one of the first to the eighth pads of the first die and the pads of the second die.

2. The die stacking structure as claimed in claim 1, wherein the second die further comprising:
   a third conductive via, passing through the second die, wherein the third conductive via comprises a ninth pad and a tenth pad, the ninth pad is located at a first side of the second die, the tenth pad is located at a second side of the second die, and the ninth pad and the tenth pad are partially or totally overlapped in a vertical direction of the second die;
   a fourth conductive via, passing through the second die, wherein the fourth conductive via comprises an eleventh pad and a twelfth pad, the eleventh pad is located at the first side of the second die, the twelfth pad is located at the second side of the second die, and the eleventh pad and the twelfth pad are partially or totally overlapped in a vertical direction of the second die;
   a thirteenth pad, located at the first side of the second die, and conducted to the eleventh pad;
   a fourteenth pad, located at the second side of the second die, and conducted to the tenth pad, and the fourteenth pad and the thirteenth pad being partially or totally overlapped in a vertical direction of the second die;
   a fifteenth pad, located at the first side of the second die, and conducted to the ninth pad; and
   a sixteenth pad, located at the second side of the second die, and conducted to the twelfth pad, and the sixteenth pad and the fifteenth pad being partially or totally overlapped in a vertical direction of the second die.

3. The die stacking structure as claimed in claim 2, further comprising a second conductive bump coupled between the second pad and the ninth pad.

4. The die stacking structure as claimed in claim 2, further comprising a second conductive bump coupled between the fourth pad and the eleventh pad.

5. The die stacking structure as claimed in claim 2, further comprising a second conductive bump coupled between the sixth pad and the thirteenth pad.

6. The die stacking structure as claimed in claim 2, further comprising a second conductive bump coupled between the eighth pad and the fifteenth pad.

7. The die stacking structure as claimed in claim 2, further comprising at least one second conductive bump coupled between at least one of the first to the eighth pads and at least one of the ninth to the sixteenth pads.

8. The die stacking structure as claimed in claim 1, wherein the first wire and the second wire are non-parallel in the vertical direction of the first die.

9. The die stacking structure as claimed in claim 8, wherein the first wire is perpendicular to the second wire in the vertical direction of the first die.

10. The die stacking structure as claimed in claim 1, wherein the first wire is perpendicular to the second wire, the third wire is perpendicular to the fourth wire, and the second wire is perpendicular to the third wire in the vertical direction of the first die.

11. A fabricating method of a die stacking structure, comprising:
   forming a first conductive via on a first die, wherein the first conductive via passes through the first die, the first conductive via comprises a first pad and a second pad, the first pad is located at a first side of the first die, the second pad is located at a second side of the first die, and the first pad and the second pad are partially or totally overlapped in a vertical direction of the first die;
   forming a second conductive via on the first die, wherein the second conductive via passes through the first die, the second conductive via comprises a third pad and a fourth pad, the third pad is located at the first side of the first die, the fourth pad is located at the second side of the first die, and the third pad and the fourth pad are partially or totally overlapped in the vertical direction of the first die;
   forming a fifth pad at the first side of the first die;
   forming a sixth pad at the second side of the first die, and the sixth pad and the fifth pad are partially or totally overlapped in the vertical direction of the first die;
   forming a seventh pad at the first side of the first die; and
   forming an eighth pad at the second side of the first die, and the eighth pad and the seventh pad are partially or totally overlapped in the vertical direction of the first die;
   forming a first wire at the first side of the first die, wherein the first pad and the seventh pad are directly connected by the first wire;
   forming a second wire at the second side of the first die, wherein the second pad and the sixth pad are directly connected by the second wire;
   forming a third wire at the first side of the first die, wherein the third pad and the fifth pad are directly connected by the third wire;
   forming a fourth wire at the second side of the first die, wherein the fourth pad and the eighth pad are directly connected by the fourth wire:
   forming at least four pads at one side of a second die; and
   selectively forming at least one first conductive bump between at least one of the first to the eighth pads of the first die and the pads of the second die, so as to conduct at least one of the first to the eighth pads of the first die and the pads of the second die.

12. The fabricating method of a die stacking structure as claimed in claim 11, the step of forming at least four pads at one side of the second die further comprising:
   forming a third conductive via on the second die, wherein the third conductive via passes through the second die, the third conductive via comprises a ninth pad and a tenth pad, the ninth pad is located at a first side of the second die, the tenth pad is located at a second side of the second die, and the ninth pad and the tenth pad are partially or totally overlapped in a vertical direction of the second die;
   forming a fourth conductive via on the second die, wherein the fourth conductive via passes through the second die, the fourth conductive via comprises an eleventh pad and a twelfth pad, the eleventh pad is located at the first side of the second die, the twelfth pad is located at the second side of the second die, and the eleventh pad and the twelfth pad are partially or totally overlapped in the vertical direction of the second die;
   forming a thirteenth pad at the first side of the second die, wherein the thirteen pad is conducted to the eleventh pad;
   forming a fourteenth pad at the second side of the second die, wherein the fourteenth pad is conducted to the tenth pad, and the fourteenth pad and the thirteenth pad are partially or totally overlapped in the vertical direction of the second die;
   forming a fifteenth pad at the first side of the second die, wherein the fifteenth pad is conducted to the ninth pad; and
   forming a sixteenth pad at the second side of the second die, wherein the sixteenth pad is conducted to the twelfth pad, and the sixteenth pad and the fifteenth pad are partially or totally overlapped in the vertical direction of the second die.

13. The fabricating method of a die stacking structure as claimed in claim 12, further comprising:

forming a second conductive bump between the second side of the first die and the first side of the second die, so as to conduct the second pad and the ninth pad.

14. The fabricating method of a die stacking structure as claimed in claim 13, further comprising:

forming a third conductive bump between the second side of the first die and the first side of the second die, so as to conduct the fourth pad and the eleventh pad, the sixth pad and the thirteenth pad, or the eighth pad and the fifteenth pad.

15. The fabricating method of a die stacking structure as claimed in claim 12, further comprising:

forming a second conductive bump between the second side of the first die and the first side of the second die, so as to conduct the sixth pad and the thirteenth pad.

16. The fabricating method of a die stacking structure as claimed in claim 15, further comprising:

forming a third conductive bump between the second side of the first die and the first side of the second die, so as to conduct the eighth pad and the fifteenth pad.

* * * * *